United States Patent [19]
Gardner et al.

[11] Patent Number: 6,117,742
[45] Date of Patent: Sep. 12, 2000

[54] METHOD FOR MAKING A HIGH PERFORMANCE TRANSISTOR

[75] Inventors: Mark I. Gardner, Cedar Creek; Fred Hause, Austin, both of Tex.

[73] Assignee: Advanced Micro Devices, Inc., Austin, Tex.

[21] Appl. No.: 09/079,760

[22] Filed: May 15, 1998

[51] Int. Cl.[7] .................... H01L 21/336; H01L 21/3205; H01L 21/4763
[52] U.S. Cl. ............................. 438/301; 438/592
[58] Field of Search ..................... 438/301, 592, 438/300, 305, 291

[56] References Cited

U.S. PATENT DOCUMENTS

| | | | |
|---|---|---|---|
| 4,597,827 | 7/1986 | Nishitani et al. | 156/643 |
| 4,778,774 | 10/1988 | Blossfeld | 437/31 |
| 4,878,994 | 11/1989 | Jucha et al. | 156/643 |
| 4,975,385 | 12/1990 | Beinglass et al. | 437/44 |
| 5,175,119 | 12/1992 | Matsutani | 437/43 |
| 5,605,855 | 2/1997 | Chang et al. | 437/45 |
| 5,627,105 | 5/1997 | Delfino et al. | 438/627 |
| 5,691,212 | 11/1997 | Tsai et al. | 437/24 |
| 5,707,883 | 1/1998 | Tabara | 437/40 |
| 5,707,889 | 1/1998 | Hsu et al. | 437/69 |
| 5,817,579 | 10/1998 | Ko et al. | 438/740 |
| 5,888,888 | 3/1999 | Talwar et al. | 438/592 |

Primary Examiner—Jey Tsai
Assistant Examiner—Walter L. Lindsay, Jr.
Attorney, Agent, or Firm—Williams, Morgan & Amerson, P.C.

[57] ABSTRACT

The present invention is directed to a method for manufacturing a semiconductor device having a reduced feature size and improved electrical performance characteristics. The method includes forming at least one masking layer and forming an opening in said masking layer. The method further includes forming a metal layer above at least a portion of said masking layer and removing said masking layer to define a gate electrode comprised of a portion of said metal layer. The method also includes removing the masking layer to expose portions of the surface of the substrate and doping the exposed portions of the substrate to define at least one source or drain region.

37 Claims, 4 Drawing Sheets

METHOD FOR MAKING A HIGH PERFORMANCE TRANSISTOR

BACKGROUND OF THE INVENTION

1. Field of the Invention

This invention generally relates to semiconductor processing, and, more particularly, to the formation of transistors.

2. Description of the Related Art

In general, there has always been, and continues to be, a desire to make semiconductor devices smaller. Reductions in the size of semiconductor devices provides numerous benefits. For example, all other things being equal, the production yields of semiconductor devices with a smaller feature size are increased because more devices may be fabricated on a single wafer. Additionally, smaller feature sizes may also result in increased electrical performance of the completed integrated circuit device.

In traditional field effect transistors, the gate electrode may be made from a doped polysilicon. The particular dopant material selected and the concentration of the dopant material will depend, in part, on the technology involved, e.g., NMOS, PMOS or CMOS, as well as the desired electrical performance characteristics of the semiconductor device under consideration.

One of the problems associated with using doped polysilicon as the gate electrode is the lack of uniform distribution of the dopant material throughout the polysilicon after the dopant material is initially applied. The non-uniform distribution of dopant material is particularly problematic at the interface of the gate electrode and the gate oxide.

Attempts to alleviate this problem have typically included subjecting the doped polysilicon gate electrode to one or more heat treatments. The purpose of these heat treatments is to more evenly distribute the dopant material in the polysilicon and to drive more of the dopant material deeper into the polysilicon, i.e., toward the interface of the polysilicon gate electrode and the gate oxide.

However, the use of heat treatments to attempt to rectify the above problems causes other problems in the fabrication of semiconductor devices. For example, when a semiconductor device is heated to more evenly distribute the dopant material in the polysilicon, other doped regions in the semiconductor device may also experience a spreading of the dopant material from its original site. To account for this undesirable spreading of doped regions during heat treatments, semiconductor devices are designed such that the affected doped regions are spaced farther apart than they would be if no such heat treatments were applied to the semiconductor device.

The present invention is directed to a method and device that solves some or all of the aforementioned problems.

SUMMARY OF THE INVENTION

The present invention is directed to a method for manufacturing a semiconductor device having a reduced feature size and improved electrical performance characteristics. The method includes forming at least one masking layer and forming an opening in said masking layer. The method further includes forming a metal layer above at least a portion of said masking layer and removing said masking layer to define a gate electrode comprised of a portion of said metal layer. The method also includes removing the masking layer to expose portions of the surface of the substrate and doping the exposed portions of the substrate to define at least one source or drain region.

BRIEF DESCRIPTION OF THE DRAWINGS

The invention may be understood by reference to the following description taken in conjunction with the accompanying drawings, in which like reference numerals identify like elements, and in which.

Figure 1:
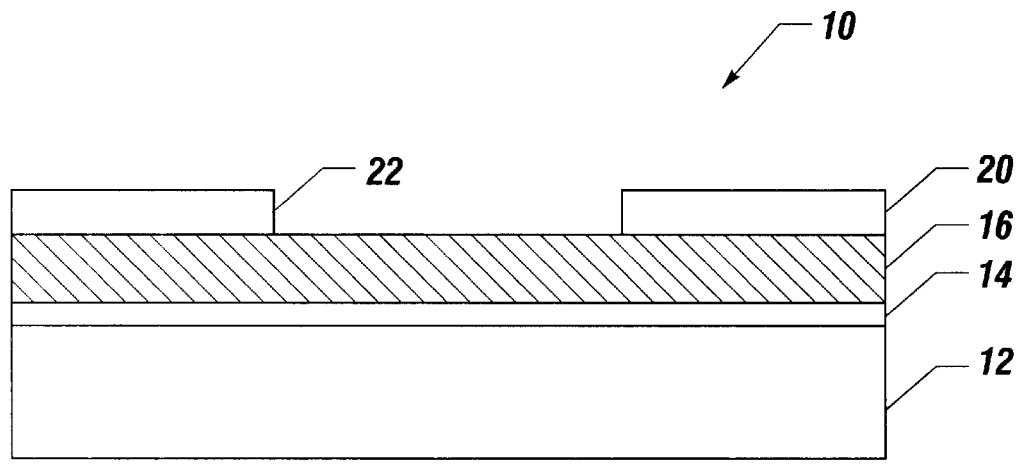
FIG. 1 is a cross-sectional view of a semiconductor device with an oxide layer, masking layer and photoresist layer.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

With reference to FIGS. 1–10, the present invention will now be described in further detail. As shown in FIG. 1, a semiconductor device 10 may be created by forming an oxide layer 14 above a substrate 12, forming a masking layer 16 above the oxide layer 14, and forming a photoresist layer 20 above the masking layer 16. The photoresist layer 20 may be patterned to define an opening 22.

The substrate 12 may be any semiconductor material, and, in one embodiment, the substrate 12 is silicon. In one embodiment, the oxide layer 14 may range in thickness between 20–50 Å. As is readily apparent to those skilled in the art, the masking layer 16 may be any of a variety of materials. In an illustrative example, the masking layer 16 may be nitride and may range in thickness between 500–1000 Å. The oxide layer 14 and the masking layer 16 may be formed by a variety of techniques, including, but not limited to, thermal growing, chemical vapor deposition (CVD), sputtering, or low pressure chemical vapor deposition (LPCVD).

Figure 2:
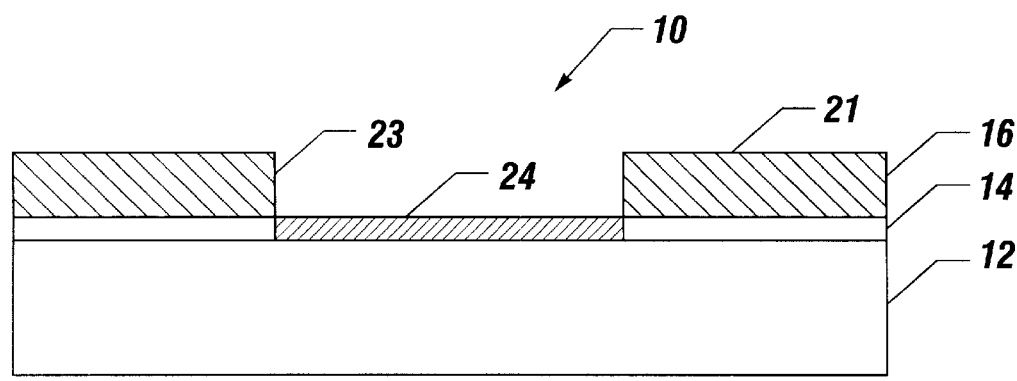
FIG. 2 is a cross-sectional view of a semiconductor device with a portion of the masking layer and oxide layer removed.

As shown in FIGS. 1 and 2, the next process involves removal of the masking layer 16 and the oxide layer 14 in the area defined by the opening 22 in the photoresist layer 20. This step results in the formation of an opening 23 in the masking layer 16 and the oxide layer 14. After this is accomplished, a gate oxide layer 24 is formed above the substrate 12 as shown in FIG. 2. In one embodiment, the masking layer 16 and the oxide layer 14 within the area defined by opening 22 may be removed, for example, by a plasma etching process or by a plasma etching process in combination with a wet etching process. For example, the masking layer 16 and oxide layer 14 may be removed in a single plasma etching process using HBr and $Cl_2$ as the etchant gases. Additionally, in one embodiment, the gate oxide layer 24 may range in thickness between 20–30 Å and may be formed by thermally growing the gate oxide layer 24 (at, for example, a temperature of 800–1000° C.) or by deposition of the gate oxide layer 24 by a variety of processes, e.g., CVD, LPCVD or sputtering.

Figure 3:
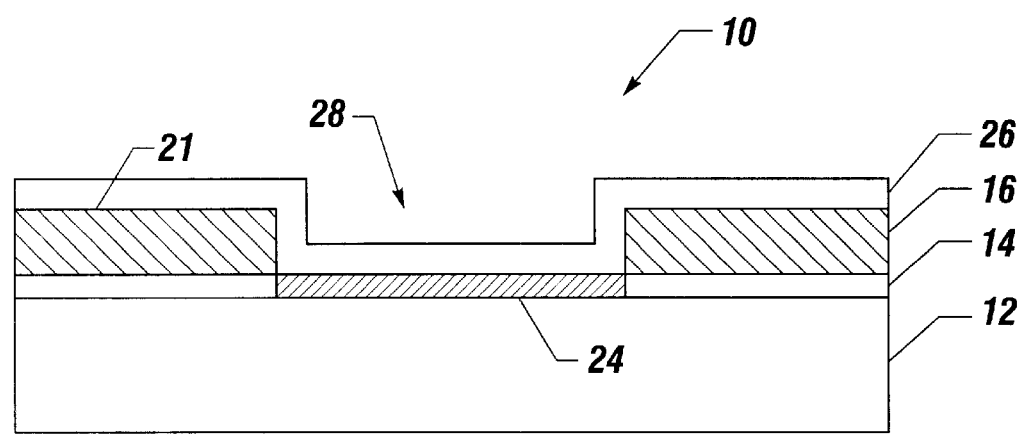
FIG. 3 is a cross-sectional view of a semiconductor device after a metal layer has been formed on the device.

As shown in FIG. 3, a conformal layer of metal 26 is next formed in the opening 23 in the masking layer 16 and above the gate oxide layer 24. Portions of the metal layer 26 may also be formed on the surface 21 of the masking layer 16. In one embodiment, the metal layer 26 is comprised of Tininitride (commonly referred to in the industry as TiN) and the metal layer 26 may range in thickness between 75–300 Å. Other suitable materials for the metal layer 26 include, but are not limited to, tungsten, tinitride, etc. The metal layer 26 may be formed by a variety of processes, including, but not limited to, CVD, LPCVD or sputtering.

Figure 4:
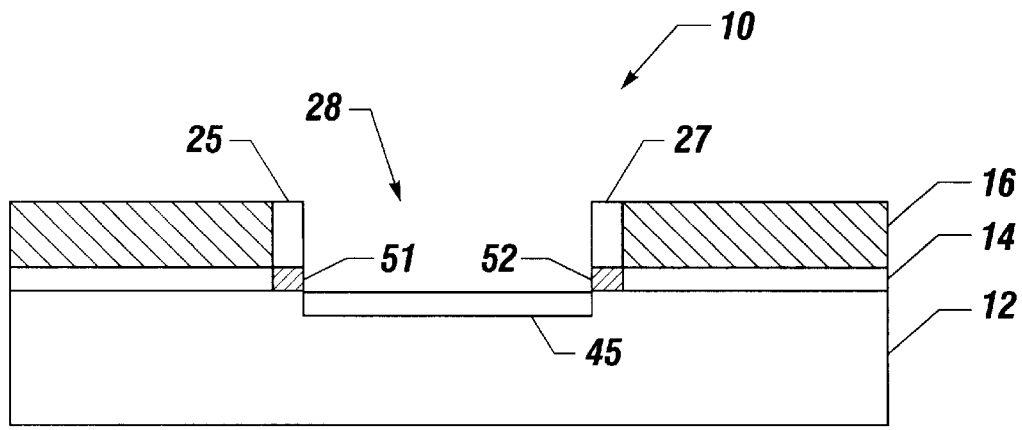
FIG. 4 is a cross-sectional view of a semiconductor device after a portion of the metal layer has been removed.

As shown in FIG. 4, the next process involves removal of portions of the metal layer 26. When completed, this process results in the formation of gate electrodes 25 and 27. That is, an anisotropic etch of the metal layer 26 is performed to remove the metal layer 26 above the masking layer 16 and a portion of the metal layer 26 formed on the gate oxide layer 24 in the bottom of the opening 28. The portion of the gate oxide layer 24 between the gate electrodes 25 and 27 is also removed. However, portions 51 and 52 of the gate oxide layer 24 remain under the gate electrodes 25 and 27, respectively. Thereafter, the exposed surface of the substrate 12 between the gate electrodes 25 and 27 is lightly doped as indicated by the region 45 in FIG. 4. This lightly doped region 45 is self-aligned to the gate electrodes 25 and 27. The width of the gate electrodes 25 and 27 formed by this process may range between 75–300 Å and, in one embodiment, the width of the gate electrodes 25 and 27 is approximately 175 Å. Of course, those skilled in the art recognize that the width of the gate electrodes 25 and 27 is a matter of design choice that depends, in part, on the semiconductor device to be constructed.

The anisotropic etch process used to form the gate electrodes 25 and 27 may also be useful for removing the gate oxide layer 24 between the gate electrodes 25 and 27. Alternatively, a separate process step may be performed to remove any portions of the gate oxide layer 24 that remain after the portion of the metal layer 26 that is positioned on the gate oxide layer 24 has been removed. In one embodiment, the removal of portions of the metal layer 26 is accomplished by plasma etching using, for example, $ArCl_2$ and $ArSf_6$ as the etchant gases. Of course, the particular techniques selected for removal of portions of the metal layer 26 are a matter of design choice. Additionally, if the removal is to be performed by etching, the etchant gases used will vary depending upon various design and process considerations.

With regard to the lightly doped region 45, in one embodiment, for example, involving NMOS technology, the dopant material may be an N-type dopant material, such as arsenic or phosphorous, that may be applied by an ion implantation process at a concentration ranging between $5 \times 10^{13}$ ions/cm$^2$–$8 \times 10^{14}$ ions/cm$^2$ at an energy level of 1–10 keV.

Figure 5:
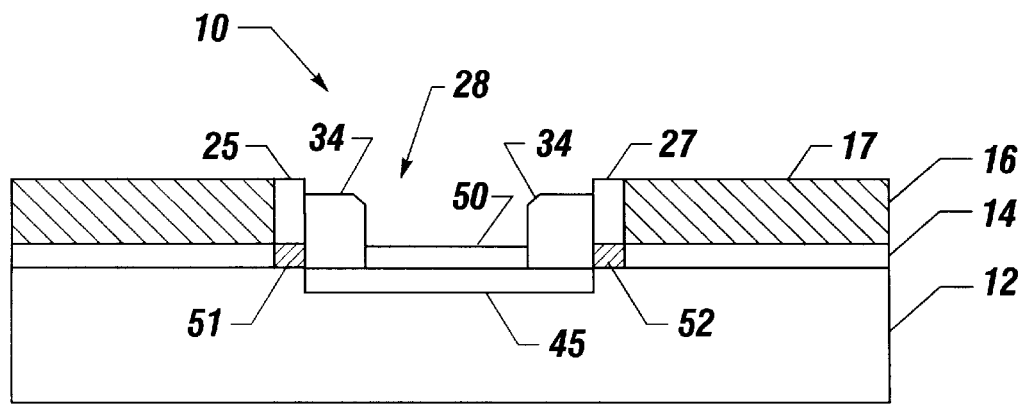
FIG. 5 is a cross-sectional view of a semiconductor device with spacers formed adjacent the gate electrodes of the device.

As shown in FIG. 5, the next process involves formation of the spacers 34 in the opening 28 adjacent the gate electrodes 25 and 27. The process involves depositing a spacer material into the opening 28 and on the surface 17 of the masking layer 16. The spacer material is then subjected to an anisotropic etching process which results in the configuration of the spacers 34 shown in FIG. 5. In one embodiment, the spacer may be made of oxide or oxynitride and may range in thickness between 200–500 Å. In one embodiment, the spacers 34 are formed by plasma etching using, for example, $ArCHF_3$ and $ArCF_4$ as the etchant gases. If etching is used to form the spacers 34, a highly selective etch chemistry must be used so as not to etch away the masking layer 16 or the gate electrodes 25 and 27.

After the formation of the spacers 34, a sacrificial oxide layer 50 may be formed on the substrate 12 in the area between the spacers 34. The sacrificial oxide layer 50 is used to protect the substrate 12 during the subsequent removal of the masking layer 16 (discussed below). As is readily apparent to those skilled in the art, the sacrificial oxide layer 50 may be formed by a variety of techniques, e.g., thermal growth, deposition, and may range in thickness between 20–50 Å.

The next process will be discussed with reference to FIG. 6. Initially, the masking layer 16, oxide layer 14, and sacrificial oxide layer 50 are removed. The removal of these layers may be accomplished by a variety of techniques and may be accomplished in a single or in multiple steps. For example, the masking layer 16, oxide layer 14 and oxide layer 50 may be removed in a single plasma etching step using, for example, $ArCHF_3$ and $ArCF_4$ as the etchant gases. Alternatively, the masking layer 16 may be removed by plasma etching followed by a wet etch removal of the oxide layers 14 and 50.

Thereafter, the exposed surface of the substrate 12 is lightly-doped. This light-doping step results in the regions 36 shown in FIG. 6. Note that these lightly doped regions 36 are self-aligned to their respective gate electrodes 25 and 27. As those skilled in the art recognize, the light doping of the substrate 12 in the areas adjacent the gate electrodes 25 and 27 is performed to provide for increased transistor performance, e.g., reduce the impact of hot carrier effects. These lightly doped areas, such as, for example, regions 36 shown in FIG. 6, may be created by a variety of techniques. In one embodiment, for example, involving NMOS technology, the dopant material may be arsenic or phosphorous, and the dopant material may be applied at a concentration of between $5 \times 10^{13}$ ions/cm$^2$–$8 \times 10^{14}$ ions/cm$^2$ by an ion implantation process at 1–10 keV energy level.

Figure 6:
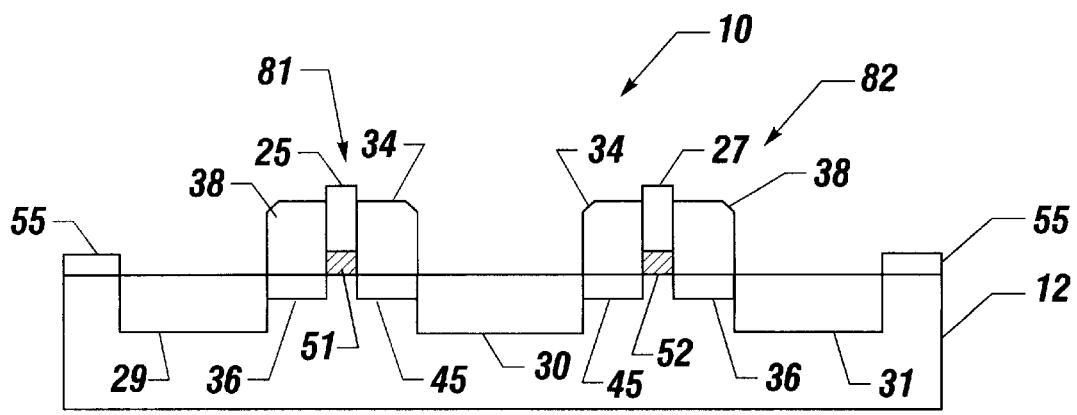
FIG. 6 is a cross-sectional view of a completed semiconductor device.

Thereafter, spacers 38 are formed adjacent the gate electrodes 25 and 27 as shown in FIG. 6. In one embodiment, as discussed above with respect to the formation of the spacers 34, the formation of the spacers 38 may involve the deposition of a spacer material followed by an etching of the spacer material. After formation of the spacers 38, the exposed areas of the substrate 12 are then heavily doped with an appropriate dopant material to form source/drain regions 29, 30 and 31. That is, the portion of the substrate 12 between the previously formed field oxide layer 55 and the spacers 38, as well as the portion of the substrate 12 between the spacers 34, is heavily doped. The dopant material and the concentration of the dopant material may vary depending upon design considerations. However, in one embodiment (for NMOS technology), the dopant material may be arsenic or phosphorous applied by ion implantation at a concentration of $2-8\times10^{15}$ ions/cm at 1–10 keV. It should be noted that the designation of the areas 29, 30 and 31 as source/drain regions is meant to reflect that, as recognized by those skilled in the art, these regions may serve either function depending upon the polarity of the particular circuit in which the device is used.

Figure 7:
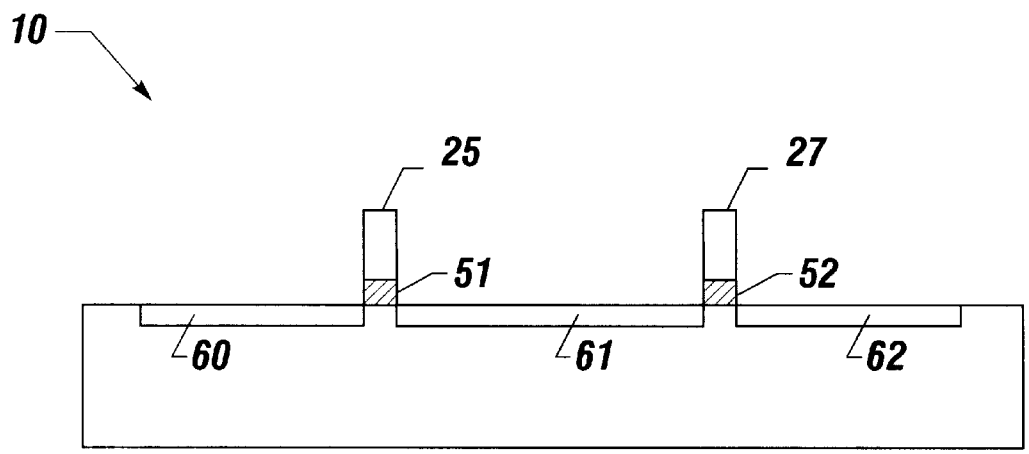
FIG. 7 is a cross-sectional view of an alternative technique for forming a semiconductor device.
Figure 8:
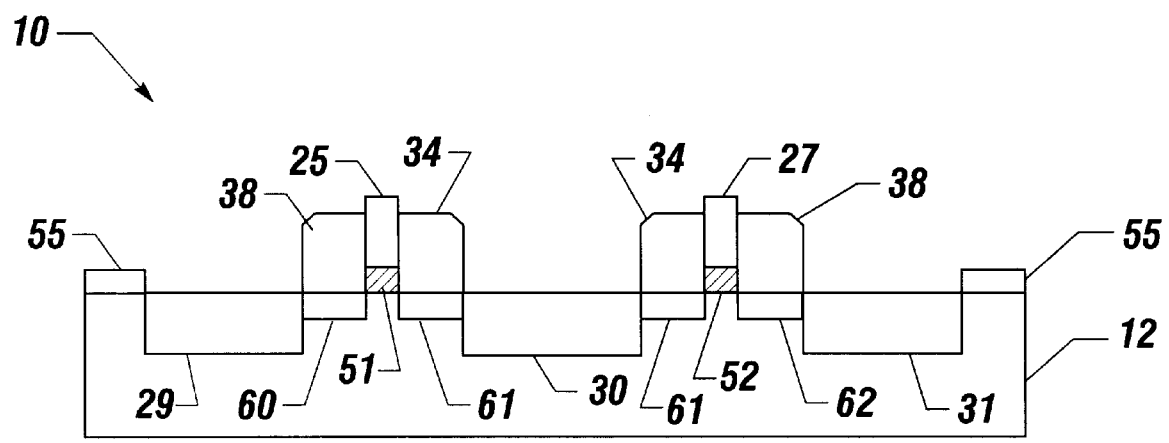
FIG. 8 is a cross-sectional view of a completed semiconductor device formed using an alternative technique.

After the formation of the structure shown in FIG. 4, an alternative technique for completing the semiconductor device 10 is shown in FIGS. 7 and 8. Starting with the semiconductor device shown in FIG. 4, the alternative technique involves (see FIG. 7) removal of the masking layer 16 and oxide layer 14. As discussed above, these layers may be removed in a single process step or in multiple process steps and the removal of these layers may be accomplished by a variety of techniques, including those discussed above.

After the masking layer 16 and oxide layer 14 are removed, the exposed surface of the substrate 12 is lightly doped, thereby forming regions 60, 61 and 62. Note that the regions 60, 61 and 62 are self-aligned with respect to their respective gate electrodes 25 and 27. In one embodiment, for example, a device involving NMOS technology, the light doping of these regions may be accomplished using arsenic or phosphorous as the dopant material that is applied by ion implantation at a concentration of between $5\times10^{13}$ ions/cm$^2$–$8\times10^{14}$ ions/cm$^2$ at 1–10 keV.

As shown in FIG. 8, the next process involves formation of the spacers 34 and 38 adjacent the gate electrodes 25 and 27. The spacers 34 and 38 may be formed by a variety of techniques, including those discussed above. Thereafter, the portions of the substrate 12 between the field oxide 55 and the spacers 38, and the portion of the substrate 12 between the spacers 34, are heavily doped to form source/drain regions 29, 30 and 31 in the substrate 12.

Figure 9:
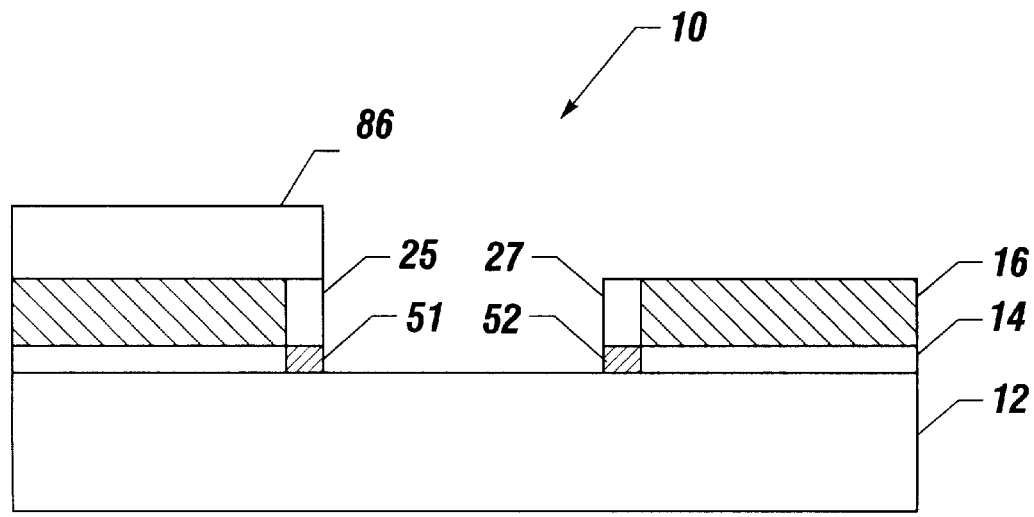
FIG. 9 is a cross-sectional view showing the partial formation of a single semiconductor device using the present method.
Figure 10:
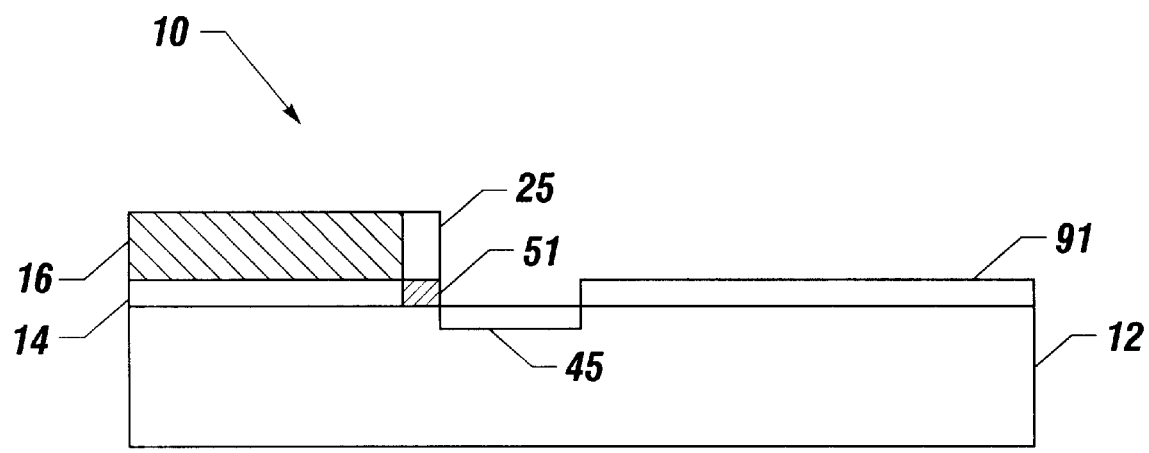
FIG. 10 is also a cross-sectional view showing the partial formation of a single semiconductor device using the present method.

Although the present invention has been heretofore disclosed in the context of the formation of a pair of chained semiconductor devices 80 and 82 (see FIG. 6) having a common source/drain 30, the present method may also be used to form a single semiconductor device. This may be accomplished by performing the above-described processes on the semiconductor device to arrive at the structure shown in FIG. 4 prior to the formation of the lightly doped region 45. Thereafter, as shown in FIG. 9, a photoresist layer 86 may be applied to mask off a portion of the semiconductor device as it existed in FIG. 4. Next, the exposed portion of the masking layer 16, oxide layer 14, gate oxide layer 52 and gate electrode 27 are removed, which results in the structure shown in FIG. 10 (the photoresist layer 86 is not shown in this figure). The removal of the masking layer 16, oxide layer 14, gate oxide layer 52, and gate electrode 27 may be accomplished in one or more processing steps. For example, all of the identified components may be removed in a single plasma etching step or by a combination of a plasma etching process followed by a wet etching process to remove the oxide layers. After removal of the masking layer 16, oxide layer 14, gate oxide layer 52 and gate electrode 27, an oxide layer 91 may be formed on substrate 12 to define an edge of a source and drain region to be subsequently formed in the substrate 12. Thereafter, the photoresist layer 86 is removed and the remaining components of the semiconductor device 81 are formed, i.e., the lightly doped regions 45 and 36, the regions 29 and 30, and spacers 34 and 38, as described above with respect to the formation of the chained semiconductor devices.

The present invention is a new and improved method for formation of semiconductor transistors. Although the various regions and structures discussed above are depicted in the drawings as having very precise edges and corners, those skilled in the art recognize that such regions and structures, e.g., the source/drain regions, do not have the precise boundaries depicted in the drawings. As will be readily apparent to those of ordinary skill in the art, the technique disclosed herein for the formation of semiconductor structures is readily applicable to a variety of semiconductor processing technologies, including NMOS, PMOS, and CMOS. Through use of the present methods, semiconductor devices may be manufactured with a smaller feature size than current generation products. For example, employing the novel techniques disclosed herein, a field effect transistor may be fabricated with a channel length ranging between approximately 750–300 Å. This reduced feature size improves the performance of the semiconductor device. For example, with all other things being equal, a field effect transistor with a shorter channel length will operate at a faster speed. The reduced feature size also increases the yield of finished semiconductor devices in that, all other things being equal, more devices may be made from a single wafer.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for making a semiconductor device, said semiconductor device having a substrate, comprising:

forming a first layer above said semiconducting substrate, forming at least one masking layer above said first layer;

forming an opening in said masking layer and in said first layer, said opening defining an area;

forming a gate oxide layer above said substrate in at least a portion of the area defined by said opening in said first layer;

forming at least one gate electrode in said opening and above said gate oxide layer; removing said at least one masking layer; and forming at least one source and drain region adjacent said gate electrode.

2. The method of claim 1, wherein forming at least one gate electrode comprises:

forming a layer of metal in said opening and above said gate oxide layer; and removing a portion of said metal layer to define said at least one metal gate electrode.

3. The method of claim 1, wherein forming at least one source and drain region adjacent said gate electrode comprises forming at least one self-aligned source and drain region adjacent said gate electrode.

4. The method of claim 1, wherein forming at least one gate electrode comprises forming at least two gate electrodes.

5. The method of claim 4, wherein forming at least two gate electrodes comprises:

forming a layer of metal in said opening and above said gate oxide layer; and removing a portion of said metal layer to define said at least two metal gate electrodes.

6. The method of claim 1, wherein forming an opening in said masking layer comprises:

forming a layer of photoresist above said at least one masking layer;

patterning said layer of photoresist to define an opening; and removing a portion of said at least one masking layer that is positioned beneath said opening.

7. The method of claim 1, wherein forming at least one masking layer comprises forming at least one layer of oxide.

8. The method of claim 1, wherein forming at least one masking layer comprises forming at least one layer of nitride.

9. The method of claim 1, wherein forming at least one masking layer comprises forming at least one layer of oxide and at least one layer of nitride.

10. The method of claim 2, wherein forming a layer of metal in said opening comprises forming a layer of tinitride in said opening.

11. The method of claim 2, wherein forming a layer of metal in said opening comprises forming a layer of tungsten in said opening.

12. The method of claim 2, wherein forming a layer of metal in said opening comprises forming a layer of metal by chemical vapor deposition.

13. The method of claim 2, wherein forming a layer of metal in said opening comprises forming a layer of metal by sputtering of said layer of metal.

14. The method of claim 2, wherein forming a layer of metal in said opening comprises forming a layer of metal by low pressure chemical vapor deposition of said layer of metal.

15. The method of claim 2, wherein removing a portion of said metal layer comprises etching a portion of said metal layer.

16. The method of claim 2, wherein removing a portion of said metal layer comprises plasma etching a portion of said metal layer.

17. The method of claim 1, wherein removing said at least one masking layer comprises etching said at least one masking layer.

18. The method of claim 1, wherein removing said at least one masking layer comprises plasma etching said at least one masking layer.

19. The method of claim 1, wherein forming at least one source and drain region comprises implanting a dopant material into said substrate.

20. The method of claim 1, wherein forming at least one source and drain region comprises performing a separate light doping process and a separate heavy doping process.

21. A method for making a semiconductor device, comprising:

forming a first layer above said semiconducting substrate;

forming at least one masking layer above said first layer;

forming an opening in said masking layer, said opening defining an area;

removing said first layer lying within the area defined by said opening in said masking layer to thereby define an opening in the first layer;

forming a gate oxide layer above said substrate in at least a portion of the area defined by said opening in said first layer;

depositing a layer of metal in at least said opening in said masking layer and above said gate oxide layer;

etching at least one portion of said metal layer to define at least one metal gate electrode comprised of a portion of said metal layer;

removing said at least one masking layer; and forming at least one source and drain region in said substrate adjacent said at least one metal gate electrode.

22. The method of claim 21, wherein forming at least one source and drain region adjacent said gate electrode comprises forming at least one self-aligned source and drain region adjacent said gate electrode.

23. The method of claim 21, wherein etching at least one portion of said metal layer to define at least one metal gate electrode comprised of a portion of said metal layer comprises etching at least one portion of said metal layer to define at least two metal gate electrodes comprised of a portion of said metal layer.

24. The method of claim 21, wherein forming an opening in said masking layer comprises:

forming a layer of photoresist on said at least one masking layer;

patterning said layer of photoresist to define an opening; and removing a portion of said at least one masking layer that is positioned beneath said opening.

25. The method of claim 21, wherein forming at least one masking layer comprises forming at least one layer of oxide.

26. The method of claim 21, wherein forming at least one masking layer comprises forming at least one layer of nitride.

27. The method of claim 21, wherein forming at least one masking layer comprises forming at least one layer of oxide and at least one layer of nitride.

28. The method of claim 21, wherein depositing a layer of metal in said opening comprises depositing a layer of tinitride in said opening.

29. The method of claim 21, wherein depositing a layer of metal in said opening comprises depositing a layer of tungsten in said opening.

30. The method of claim 21, wherein depositing a layer of metal in said opening comprises depositing a layer of metal by chemical vapor deposition.

31. The method of claim 21, wherein depositing a layer of metal in said opening comprises depositing a layer of metal by sputtering of said layer of metal.

32. The method of claim 21, wherein depositing a layer of metal in said opening comprises depositing a layer of metal by low pressure chemical vapor deposition of said layer of metal.

33. The method of claim 21, wherein removing said at least one masking layer comprises etching said at least one masking layer.

34. The method of claim 21, wherein removing said at least one masking layer comprises plasma etching said at least one masking layer.

35. The method of claim 21, wherein forming at least one source and drain region comprises implanting a dopant material into said substrate.

36. The method of claim 21, wherein forming at least one source and drain region comprises performing a separate light doping process and a separate heavy doping process.

37. A method for making a semiconductor device, comprising:

forming a first layer above a semiconducting substrate;

forming at least one masking layer above the first layer;

forming an opening in said masking layer, said opening defining an area;

removing said first layer lying within the area defined by the opening in the masking layer to thereby define an opening in the first layer;

forming a gate oxide layer above said substrate in at least a portion of the area defined by said opening in said first layer;

depositing a layer of metal in at least said opening in said masking layer and above said gate oxide layer;

etching at least one portion of said metal layer to define at least two metal gate electrodes comprised of a portion of said metal layer;

removing said at least one masking layer; and forming at least one source and drain region in said substrate adjacent each of said at least two metal gate electrodes.

* * * * *